(12) United States Patent
Alvarez Rivera et al.

(10) Patent No.: US 9,087,801 B2
(45) Date of Patent: Jul. 21, 2015

(54) POWER EFFICIENT ORGANIC LIGHT EMITTING DIODE DISPLAY

(75) Inventors: Felix Jose Alvarez Rivera, San Jose, CA (US); Albert John Golko, Saratoga, CA (US); Daniel William Jarvis, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 277 days.

(21) Appl. No.: 12/770,520

(22) Filed: Apr. 29, 2010

(65) Prior Publication Data
US 2011/0267279 A1 Nov. 3, 2011

(51) Int. Cl.
*G09G 5/00* (2006.01)
*H01L 27/32* (2006.01)

(52) U.S. Cl.
CPC ........ *H01L 27/3244* (2013.01); *H01L 27/3232* (2013.01); *G02F 2201/44* (2013.01); *G09G 2300/023* (2013.01); *H01L 2251/5323* (2013.01)

(58) Field of Classification Search
CPC .......................... G09G 3/344; G09G 2300/023
USPC ......... 345/3.1–3.4, 76–82, 102, 107, 87, 4–5; 349/16; 362/551–582, 600–634; 341/51–60; 313/485–486
See application file for complete search history.

(56) References Cited

U.S. PATENT DOCUMENTS

| | | | | |
|---|---|---|---|---|
| 4,194,833 A * | 3/1980 | Lester et al. | | 399/4 |
| 4,364,039 A * | 12/1982 | Penz | | 345/4 |
| 4,826,296 A * | 5/1989 | Yoshimura | | 349/68 |
| 5,206,746 A * | 4/1993 | Ooi et al. | | 349/62 |
| 5,596,341 A * | 1/1997 | Miller | | 345/52 |
| 6,147,934 A * | 11/2000 | Arikawa et al. | | 368/84 |
| 6,816,217 B2 * | 11/2004 | Sone | | 349/114 |
| 6,885,495 B2 * | 4/2005 | Liang et al. | | 359/296 |
| 6,936,960 B2 * | 8/2005 | Cok | | 313/506 |
| 7,064,740 B2 * | 6/2006 | Daly | | 345/102 |
| 7,133,015 B1 * | 11/2006 | Yoshida et al. | | 345/99 |
| 7,956,820 B2 * | 6/2011 | Huitema et al. | | 345/3.1 |
| 2002/0145687 A1* | 10/2002 | Mitsui et al. | | 349/113 |
| 2002/0171619 A1* | 11/2002 | Gordon et al. | | 345/107 |
| 2003/0156099 A1* | 8/2003 | Yrjanainen et al. | | 345/173 |
| 2004/0066480 A1* | 4/2004 | Yoshida et al. | | 349/123 |
| 2004/0252076 A1* | 12/2004 | Kodama | | 345/3.1 |
| 2005/0007517 A1* | 1/2005 | Anandan | | 349/69 |

(Continued)

FOREIGN PATENT DOCUMENTS

CN 1988169 6/2007
CN 101093851 12/2007

(Continued)

OTHER PUBLICATIONS

Japanese Office Action dated Dec. 26, 2013, JP 2013-508248, 6 pages.

(Continued)

*Primary Examiner* — Alexander Eisen
*Assistant Examiner* — Sanjiv D Patel

(57) ABSTRACT

The present disclosure relates to the use of a solid background layer in conjunction with a transparent display panel. In one such implementation, a layer that is switchable between opaque and transparent states is provided between the solid background layer and the transparent display panel. By switching the switchable layer between opaque and transparent states, visibility of the background layer through the transparent display panel may be controlled.

26 Claims, 8 Drawing Sheets

(56) References Cited

U.S. PATENT DOCUMENTS

| | | | |
|---|---|---|---|
| 2005/0083293 A1* | 4/2005 | Dixon | 345/102 |
| 2005/0104801 A1* | 5/2005 | Sugiura | 345/5 |
| 2006/0109234 A1* | 5/2006 | Hong et al. | 345/102 |
| 2006/0125779 A1* | 6/2006 | Liang et al. | 345/107 |
| 2006/0132020 A1* | 6/2006 | Kambe et al. | 313/485 |
| 2006/0256424 A1* | 11/2006 | Hou et al. | 359/296 |
| 2007/0138941 A1* | 6/2007 | Jin et al. | 313/503 |
| 2007/0188681 A1* | 8/2007 | Cho et al. | 349/114 |
| 2008/0007486 A1* | 1/2008 | Fujinawa et al. | 345/5 |
| 2008/0014919 A1 | 1/2008 | Kim et al. | |
| 2008/0100564 A1* | 5/2008 | Vincent et al. | 345/107 |
| 2008/0218448 A1* | 9/2008 | Park et al. | 345/76 |
| 2008/0258997 A1* | 10/2008 | Arai | 345/6 |
| 2009/0135365 A1* | 5/2009 | Dunn | 349/161 |
| 2009/0295707 A1* | 12/2009 | Furukawa et al. | 345/102 |
| 2010/0302193 A1 | 12/2010 | Park et al. | |
| 2011/0085224 A1* | 4/2011 | Addington et al. | 359/296 |

FOREIGN PATENT DOCUMENTS

| | | |
|---|---|---|
| CN | 101604085 | 12/2009 |
| JP | S58-046382 | 3/1983 |
| JP | 60-191079 | 12/1985 |
| JP | 1985-S90-191079 | 12/1985 |
| JP | H08-129194 | 5/1996 |
| JP | 09-244061 | 9/1997 |
| JP | H10-206615 | 8/1998 |
| JP | H11-242087 | 9/1999 |
| JP | 2002082352 | 3/2002 |
| JP | 2002328630 | 11/2002 |
| JP | 2004341156 | 5/2003 |
| JP | 2004294931 | 10/2004 |
| JP | 2006276089 | 10/2006 |
| JP | 2006-322971 | 11/2006 |
| JP | 2006308897 | 11/2006 |
| JP | 2008047514 | 2/2008 |
| JP | 2008197634 | 8/2008 |
| WO | 2005088594 | 9/2005 |
| WO | 2007107903 | 9/2007 |
| WO | 2008123643 | 10/2008 |
| WO | 2009127917 | 10/2009 |
| WO | 2010030075 | 3/2010 |

OTHER PUBLICATIONS

Korean Office Action dated Nov. 28, 2013, KR 10-2012-7025796, 6 pages.
Australian Office Action dated Mar. 15, 2013, AU 2011245312, 7 pages.
Chinese Office Action dated Nov. 26, 2014, CN 201180017245.X, 18 pages.

* cited by examiner

POWER EFFICIENT ORGANIC LIGHT EMITTING DIODE DISPLAY

BACKGROUND

The present disclosure relates generally to displays for use in electronic devices and, more particularly, to the use of organic light emitting diode displays on electronic devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Organic light emitting diodes (OLEDs) are solid-state semiconductor devices that convert electrical energy into light. Generally, OLEDs are fabricated by disposing one or more layers of organic thin films between two conductors or electrodes. When electrical current is applied to the electrodes, light is emitted from the organic layers. OLED technology may be used to fabricate ultra-thin displays that can generally operate at lower voltages than traditional display technologies, such as liquid crystal display (LCD) technologies in which light is separately generated and the color of the light modulated by an LCD panel placed between the light and the viewer. In addition, an OLED display may provide better contrast ratios, frame rate, color and/or power efficiency than a comparable LCD display.

However, these advantages of an OLED display may be reduced or absent when the OLED display is used to generate large amounts of white display area. In particular, because an OLED display is a light emissive (as opposed to light transmissive) technology, to display a white area, the OLED panel typically has to energize and emit light from a range of the various color channels present at each pixel of the OLED display. As a result, the display of white areas on an OLED display may be power intensive and relatively inefficient.

The relative power inefficiency in displaying white spaces using an OLED display may be particularly problematic in certain contexts. For example, certain applications, such as word processing, spreadsheet design and use, database design and use, e-mail, and other business or productivity applications, typically utilize dark or black alphanumeric characters on a white background, such as to simulate writing or printing on a sheet of paper. As a result, these applications may cause the display of large expanses of white background with relatively little area devoted to the non-white alphanumeric characters. Such applications, therefore, may make the use of OLED displays unsuitable or undesirably power intensive for battery powered and/or portable electronic devices, such as handheld devices.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure describes the use of a display suitable for use in a battery-powered electronic device, such as a portable computer or a handheld electronic device. In one embodiment, the disclosed display includes various layers including a transparent light emissive display panel (e.g., an OLED panel) and a solid (e.g., white) or printed background layer, such as a white transflective sheet. In addition, the display includes an opacity switchable layer, disposed between the transparent light emitting panel and the background layer. The switchable layer may be switched, in whole or in part, from an opaque or semi-opaque state to a transparent or semi-transparent state. For example, in one embodiment, the switchable layer may be opaque, e.g., black, in the absence of a current. However, upon application of a current all or part of the switchable layer may become transparent so that the underlying background layer is visible.

BRIEF DESCRIPTION OF THE DRAWINGS

Various aspects of this disclosure may be better understood upon reading the following detailed description and upon reference to the drawings in which:

FIG. 5 depicts a cross-sectional view of the layers and components of an embodiment of a display panel in accordance with aspects of the present disclosure;

FIG. 6 depicts a view of a switchable layer addressable as a whole, in accordance with aspects of the present disclosure;

FIG. 7 depicts a view of a switchable layer having separately addressable regions, in accordance with aspects of the present disclosure;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The application is generally directed to the use of a background layer (e.g., a solid white or printed sheet) in conjunction with a transparent or semi-transparent, light-emitting display layer, such as an OLED panel. While other light-emissive display technologies that can be implemented as a transparent or semi-transparent layer may also be employed in conjunction with the presently disclosed embodiments, for the sake of simplicity, such light emissive and transparent or semi-transparent layers will be referred to herein as OLED layers or panels. However, it should be appreciated that use of such terminology is meant only to simplify discussion and explanation of the present disclosure, and should not be interpreted as excluding the use of other suitable display technologies unless otherwise stated.

With this in mind, in certain embodiments, an opacity switchable layer is provided between an OLED panel and the background layer. In one embodiment, all or portions of the switchable layer may be selectively switched between transparent and opaque states. In such an embodiment, when all or part of the switchable layer is transparent, the background layer is visible through the OLED layer and the transparent portions of the switchable layer. Conversely, when all or part of the switchable layer is opaque, the background is not visible through the OLED layer and the opaque portions of the switchable layer. In one implementation, an OLED display employing a switchable layer and solid background, as discussed herein, may be 30% more power efficient than a comparably sized LCD screen, while still providing superior frame rates and/or contrast.

Figure 1:
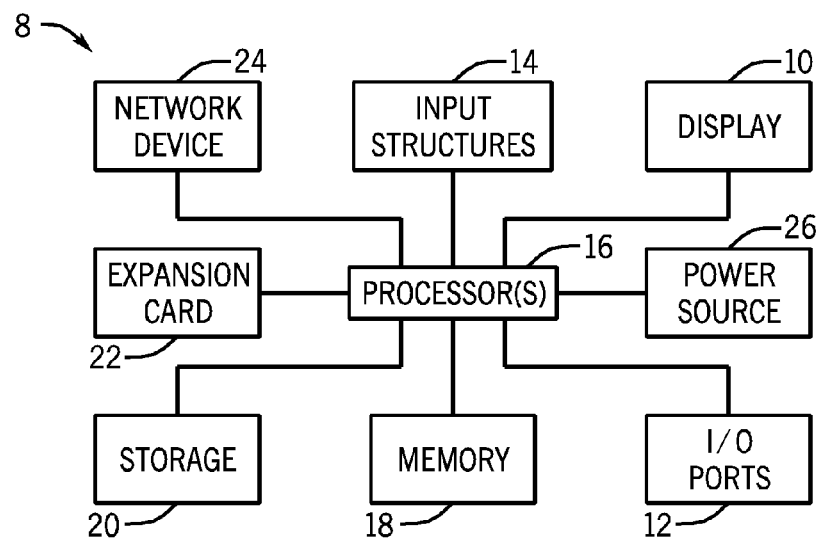
FIG. 1 is a block diagram of exemplary components of an electronic device, in accordance with aspects of the present disclosure.
Figure 2:
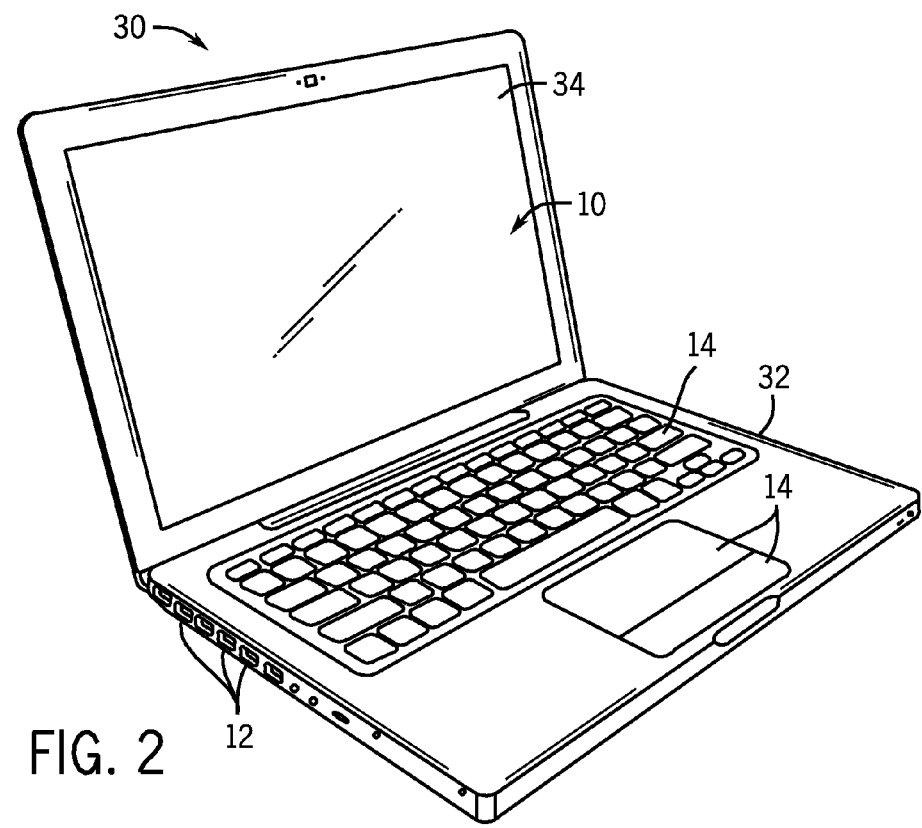
FIG. 2 is a view of a computer in accordance with aspects of the present disclosure.
Figure 3:
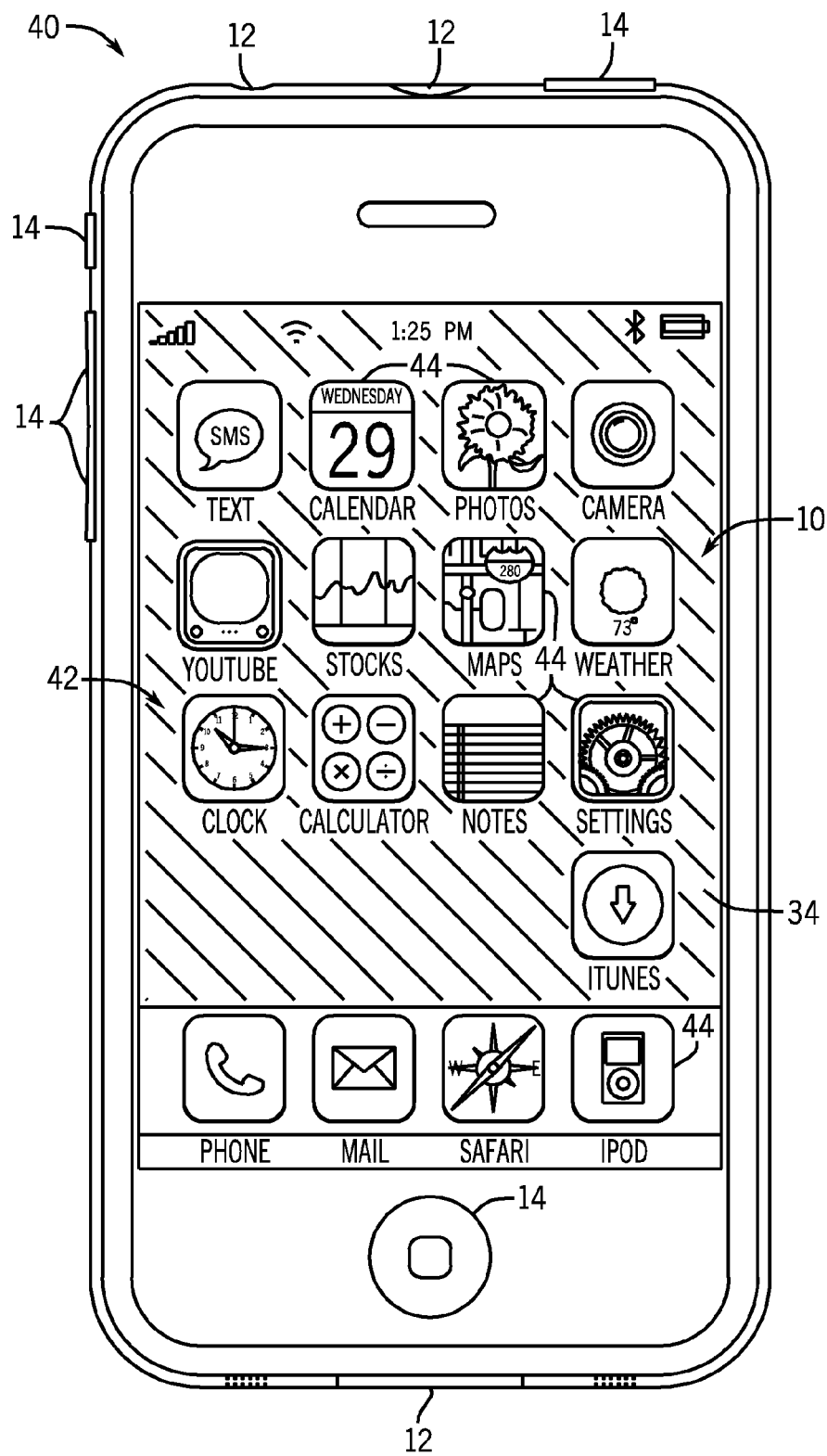
FIG. 3 is a front view of a handheld electronic device in accordance with aspects of the present disclosure.

With these foregoing features in mind, a general description of suitable electronic devices using OLED displays and having such a switchable layer is provided below. In FIG. 1, a block diagram depicting various components that may be present in electronic devices suitable for use with the present techniques is provided. In FIG. 2, one example of a suitable electronic device, here provided as a computer system, is depicted. In FIG. 3, another example of a suitable electronic device, here provided as a handheld electronic device, is depicted. These types of electronic devices, and other electronic devices having comparable display capabilities, may be used in conjunction with the present techniques.

An example of a suitable electronic device may include various internal and/or external components which contribute to the function of the device. FIG. 1 is a block diagram illustrating the components that may be present in such an electronic device 8 and which may allow the device 8 to function in accordance with the techniques discussed herein. As will be appreciated, the various functional blocks shown in FIG. 1 may comprise hardware elements (including circuitry), software elements (including computer code stored on a computer-readable medium) or a combination of both hardware and software elements. It should further be noted that FIG. 1 is merely one example of a particular implementation and is merely intended to illustrate the types of components that may be present in a device 8. For example, in the presently illustrated embodiment, these components may include a display 10, I/O ports 12, input structures 14, one or more processors 16, a memory device 18, a non-volatile storage 20, expansion card(s) 22, a networking device 24, and a power source 26.

With regard to each of these components, the display 10 may be used to display various images generated by the device 8. In one embodiment, the display 10 may consist of a layer of organic light emitting diodes (OLEDs), as well as one or more opacity switchable layers and a background layer, as discussed herein. Additionally, in certain embodiments of the electronic device 8, the display 10 may be provided in conjunction with touch-sensitive element, such as a touch screen, that may be used as part of the control interface for the device 8.

The I/O ports 12 may include ports configured to connect to a variety of external devices, such as a power source, headset or headphones, or other electronic devices (such as handheld devices and/or computers, printers, projectors, external displays, modems, docking stations, and so forth). The I/O ports 12 may support any interface type, such as a universal serial bus (USB) port, a video port, a serial connection port, a IEEE-1394 port, an Ethernet or modem port, and/or an AC/DC power connection port.

The input structures 14 may include the various devices, circuitry, and pathways by which user input or feedback is provided to the processor 16. Such input structures 14 may be configured to control a function of the device 8, applications running on the device 8, and/or any interfaces or devices connected to or used by the electronic device 8. For example, the input structures 14 may allow a user to navigate a displayed user interface or application interface. Examples of the input structures 14 may include buttons, sliders, switches, control pads, keys, knobs, scroll wheels, keyboards, mice, touchpads, and so forth.

In certain embodiments, an input structure 14 and display 10 may be provided together, such an in the case of a touch-screen where a touch sensitive mechanism is provided in conjunction with the display 10. In such embodiments, the user may select or interact with displayed interface elements via the touch sensitive mechanism. In this way, the displayed interface may provide interactive functionality, allowing a user to navigate the displayed interface by touching the display 10.

User interaction with the input structures 14, such as to interact with a user or application interface displayed on the display 10, may generate electrical signals indicative of the user input. These input signals may be routed via suitable pathways, such as an input hub or bus, to the processor(s) 16 for further processing.

The processor(s) 16 may provide the processing capability to execute the operating system, programs, user and application interfaces, and any other functions of the electronic device 8. The processor(s) 16 may include one or more microprocessors, such as one or more "general-purpose" microprocessors, one or more special-purpose microprocessors and/or ASICS, or some combination of such processing components. For example, the processor 16 may include one or more reduced instruction set (RISC) processors, as well as graphics processors, video processors, audio processors and/or related chip sets. In one embodiment, the processor(s) 16, in accordance with executed instructions, may control the operation of one or more switchable layers of the display 10, as discussed in greater detail below.

The instructions or data to be processed by the processor(s) 16 may be stored in a computer-readable medium, such as a memory 18. Such a memory 18 may be provided as a volatile memory, such as random access memory (RAM), and/or as a non-volatile memory, such as read-only memory (ROM). The memory 18 may store a variety of information and may be used for various purposes. For example, the memory 18 may store firmware for the electronic device 8 (such as a basic input/output instruction or operating system instructions), various programs, applications, or routines executed on the electronic device 8, user interface functions, processor functions, and so forth. In addition, the memory 18 may be used for buffering or caching during operation of the electronic device 8.

The components may further include other forms of computer-readable media, such as a non-volatile storage 20, for persistent storage of data and/or instructions. The non-volatile storage 20 may include flash memory, a hard drive, or any other optical, magnetic, and/or solid-state storage media. The non-volatile storage 20 may be used to store firmware, data files, software, wireless connection information, and any other suitable data.

The embodiment illustrated in FIG. 1 may also include one or more card or expansion slots. The card slots may be configured to receive an expansion card 22 that may be used to add functionality, such as additional memory, I/O functionality, or networking capability, to the electronic device 8. Such an expansion card 22 may connect to the device through any type of suitable connector, and may be accessed internally or external to the housing of the electronic device 8. For example, in one embodiment, the expansion card 22 may be a flash memory card, such as a SecureDigital (SD) card, mini- or microSD, CompactFlash card, Multimedia card (MMC), or the like.

The components depicted in FIG. 1 also include a network device 24, such as a network controller or a network interface card (NIC). In one embodiment, the network device 24 may be a wireless NIC providing wireless connectivity over any 802.11 standard or any other suitable wireless networking standard. The network device 24 may allow the electronic device 8 to communicate over a network, such as a Local Area Network (LAN), Wide Area Network (WAN), or the Internet. Further, the electronic device 8 may connect to and send or receive data with any device on the network, such as portable electronic devices, personal computers, printers, and so forth. Alternatively, in some embodiments, the electronic device 8 may not include a network device 24. In such an embodiment, a NIC may be added as an expansion card 22 to provide similar networking capability as described above.

Further, the components may also include a power source 26. In one embodiment, the power source 26 may be one or more batteries, such as a lithium-ion polymer battery or other type of suitable battery. The battery may be user-removable or may be secured within the housing of the electronic device 8, and may be rechargeable. Additionally, the power source 26 may include AC power, such as provided by an electrical outlet, and the electronic device 8 may be connected to the power source 26 via a power adapter. This power adapter may also be used to recharge one or more batteries if present.

With the foregoing in mind, FIG. 2 illustrates an electronic device 8 in the form of a computer. Such computers may include computers that are generally portable (such as laptop, notebook, and tablet computers, netbooks, and so forth) as well as computers that are generally used in one place (such as conventional desktop computers, workstations and/or servers). In certain embodiments, the electronic device 8 in the form of a computer may be a model of a MacBook®, MacBook® Pro, MacBook Air®, iMac®, Mac® mini, or Mac Pro® available from Apple Inc. By way of example, an electronic device 8 in the form of a laptop computer 30 is illustrated in FIG. 2 in accordance with one embodiment of the present invention. The depicted computer 30 includes a housing 32, a display 10 (such as the depicted OLED display panel 34), input structures 14, and input/output ports 12.

In one embodiment, the input structures 14 (such as a keyboard, mouse, and/or touchpad) may be used to interact with the computer 30, such as to start, control, or operate a GUI or applications running on the computer 30. For example, a keyboard and/or touchpad may allow a user to navigate a user interface or application interface displayed on the display 10.

As depicted, the electronic device 8 in the form of computer 30 may also include various input and output ports 12 to allow connection of additional devices. For example, the computer 30 may include an I/O port 12, such as a USB port or other port, suitable for connecting to another electronic device, a projector, a supplemental display, and so forth. In addition, the computer 30 may include network connectivity, memory, and storage capabilities, as described with respect to FIG. 1. As a result, the computer 30 may store and execute a GUI and other applications.

In addition to computers, such as the depicted laptop computer 30 of FIG. 2, an electronic device 8 may take other forms, such as an electronic handheld device 40, such as the cellular telephone depicted in FIG. 3. It should be noted that while the depicted handheld device 40 is provided in the context of a cellular telephone, other types of handheld devices (such as media players for playing music and/or video, a camera or video recorder, personal data organizers, handheld game platforms, and/or combinations of such devices) may also be suitably provided as the electronic device 8. Further, a suitable handheld device 40 may incorporate the functionality of more than one of these types of devices, such as a device that incorporates the functionality of two or more of a media player, a cellular phone, a gaming platform, a personal data organizer, and so forth. For example, in the depicted embodiment, the handheld device 40 is in the form of a cellular telephone that may provide various additional functionalities (such as the ability to take pictures, record audio and/or video, listen to music, play games, and so forth). By way of example, the handheld device 40 may be a model of an iPod® or iPhone® available from Apple Inc. of Cupertino, California.

In the depicted embodiment, the handheld device 40 includes an enclosure or body that protects the interior components from physical damage and shields them from electromagnetic interference. The enclosure may be formed from any suitable material such as plastic, metal or a composite material and may allow certain frequencies of electromagnetic radiation to pass through to wireless communication circuitry within the handheld device 40 to facilitate wireless communication.

In the depicted embodiment, the enclosure includes user input structures 14 through which a user may interface with the device. Each user input structure 14 may be configured to help control a device function when actuated. For example, in a cellular telephone implementation, one or more of the input structures 14 may be configured to invoke a "home" screen or menu to be displayed, to toggle between a sleep and a wake mode, to silence a ringer for a cell phone application, to increase or decrease a volume output, and so forth.

In the depicted embodiment, the handheld device 40 includes a display 10 that may include an OLED display panel 34. The display 10 may be used to display a graphical user interface (GUI) 42 that allows a user to interact with the handheld device 40. Generally, the GUI 42 may include graphical elements that represent applications and functions of the electronic device. The graphical elements may include icons 44 and other images representing buttons, sliders, menu bars, and the like. The icons 44 may be selected and/or activated via a touch screen included in the display 10, or may be selected by a user input structure 14, such as a wheel or button.

The handheld electronic device 40 also may include various input and output (I/O) ports 18 that allow connection of the handheld device 40 to external devices. For example, one I/O port 18 may be a port that allows the transmission and reception of data or commands between the handheld electronic device 30 and another electronic device, such as a computer. Such an I/O port 18 may be a proprietary port from Apple Inc. or may be an open standard I/O port.

With the foregoing discussion in mind, it may be appreciated that an electronic device 8 in either the form of a computer 30 or a handheld device 40 may be provided with a display 10 that includes an OLED display panel or layer. Such a display 10 may be utilized to display the respective operating system and application interfaces running on the electronic device 8 and/or to display data, images, or other visual outputs associated with an operation of the electronic device 8.

Figure 4:
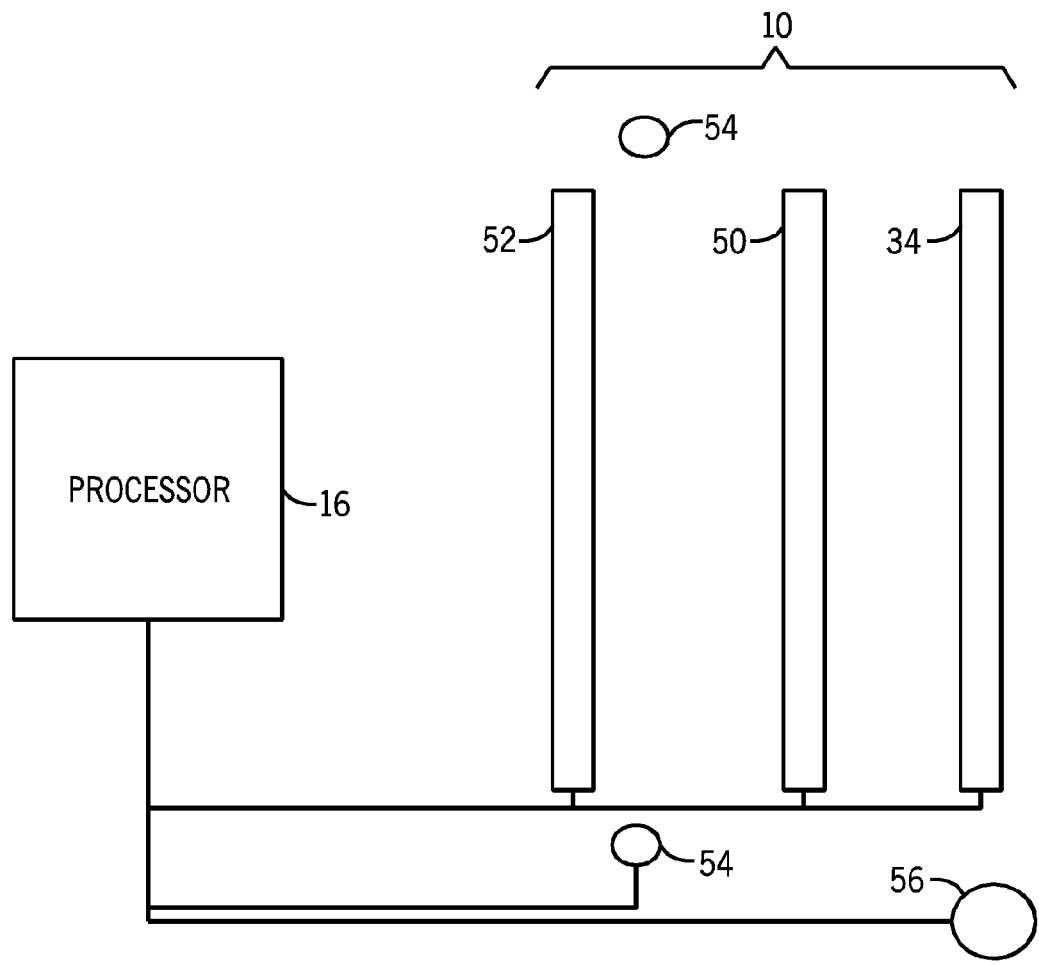
FIG. 4 depicts a schematic view of layers of a display panel in accordance with aspects of the present disclosure.

Turning now to FIG. 4, one embodiment of a display 10 for use in an electronic device 8, as discussed above, is schematically depicted. In accordance with this embodiment, a processor 16, such as a central processing unit (CPU) or graphics processing unit (GPU) is in communication with some or all of the components of the display 10. As depicted, the display 10 is a multi-layer structure that includes an OLED panel 34, an opacity switchable layer 50 (i.e., a shutter layer), and a background layer 52.

In one embodiment, the OLED panel 34 is a light emissive structure such that pixels defined within the OLED panel can emit light of various colors. That is, the pixels of the OLED display actually emit light in response to electrical control signals, as opposed to modulating a separately generated light as it is transmitted through the pixels. In one embodiment, the OLED panel 34 is transparent or substantially transparent such that the underlying layers, e.g., switchable layer 50 and/or a background layer 52, may be visible through sections of the OLED panel 34 that are not actively emitting light.

In one embodiment, the background layer 52 is an opaque layer, such as a white (or other color) printed sheet suitable for reflecting white or ambient light back toward a viewer through the transparent OLED panel 34. As discussed below, in other embodiments the background layer 52 may also be a printed sheet. In one implementation, the background layer 52 is transflective (i.e., both light transmissive and reflective) such that the background color (e.g., white) may be transmitted through a transflective surface layer, which also acts to reflect ambient light back toward the viewer.

In the depicted embodiment, between the background layer 52 and the OLED panel 34 is a switchable layer 50 that may be modulated (such as by application and/or removal of an electrical field) between an opaque (or substantially opaque) state and a transparent (or substantially transparent) state. In one embodiment, the switchable layer 50 is opaque when no electrical field is present such that the background layer 52 is not visible through the transparent OLED panel 34. In such an embodiment, the opaque state of the switchable layer 50 may provide a black or other solid color background for the OLED panel 34. In this embodiment, the switchable layer 50 may become transparent in the presence of an electrical field such that the background layer 52 is visible through the OLED panel 34 and the transparent state switchable layer 50. Further, in certain embodiments the switchable layer 50 may be divided into separately addressable sections, such that different portions of the switchable layer 50 may be separately modulated between opacity and transparency.

Various technologies may be employed in forming the switchable layer 50. In general, such switching technologies include a layer of an active material (e.g., a liquid crystal material, suspended particles, or electrochromic materials) positioned between two electrodes such that, upon application of an electrical potential, the optical properties (e.g., color, transparency, opacity) of the layer change. For example, in one embodiment, the switchable layer may be formed as a PSE hybrid layer in which in which phosphor particles are evenly dispersed in the layer in the absence of an electrical field (i.e., the opaque state) and migrate to an external periphery (e.g., a screen edge or bezel) in the presence of an electrical field (i.e., the transparent state). Other suitable switching technologies include, but are not limited to, polymer-dispersed liquid crystal (PDLC) devices, suspended particle devices (SPDs), polymeric solid electrolytes, and microblinds.

In addition to he various layers discussed above, FIG. 4 also depicts other components of a display 10 that may be present in certain embodiments. For example, in the depicted embodiment, background lights 54 (e.g. side firing fluorescent or LED background lights) may be provided to illuminate the background layer 52 in response to control signals from the processor 16. In such an embodiment, based upon an application or on the degree of ambient light (as discussed below) the processor 16 may control the opacity/transparency of the switchable layer 50 and the degree of illumination of the background layer 52.

In addition, as depicted in FIG. 4 an ambient light sensor 56 may be provided as part of the display 10. In such an embodiment, the ambient light sensor 56 may detect the amount of ambient light present in the vicinity of the display 10 and may provide a signal indicative of the amount of ambient light to the processor 16. Based on the detected ambient light, the processor 16 may control the opacity/transparency of the switchable layer 50 and/or may control the degree of illumination of the background layer 52 provided by the background lights 54.

Figure 5:
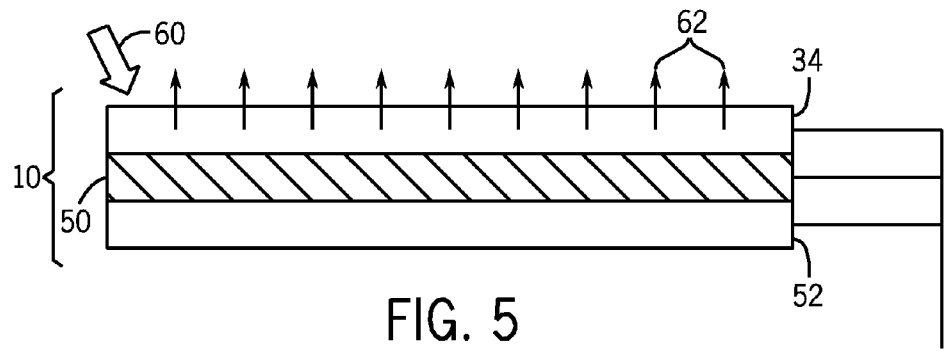
FIG. 5 depicts an example of layers of a display panel with a switchable layer set to block transmission of light in accordance with aspects of the present disclosure.
Figure 6:
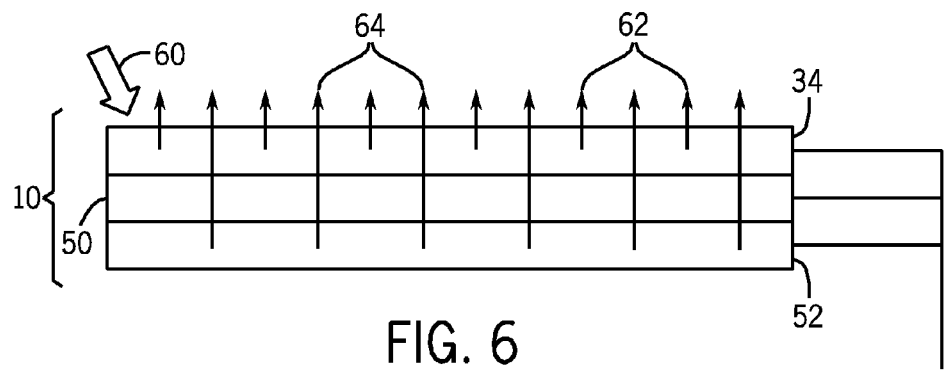
FIG. 6 depicts an example of layers of a display panel with a switchable layer set to transmit light in accordance with aspects of the present disclosure.

With the foregoing in mind and by way of example, FIGS. 5 and 6 depict the respective layers discussed with respect to FIG. 4 with the switchable layer 50 in an opaque state in FIG. 5 and in a light transmissive (e.g., transparent or clear) state in FIG. 6. In the example of FIG. 5, ambient light 60 is depicted as being incident upon the display 10. Because the switchable layer 50 is in an opaque state, the ambient light 60 does not reach, and is not reflected by, the background layer 52 (e.g., a white or transflective background layer). Thus, the light emanating from the display 10 is primarily the light 62 generated by the OLED panel 34. An example of this effect is depicted in FIG. 3, in which a home screen of the handheld device 40 is depicted as having a generally dark or black background which, in accordance with one embodiment, may be implemented by setting a switchable layer 50 of the display 10 to an opaque state.

Figure 7:
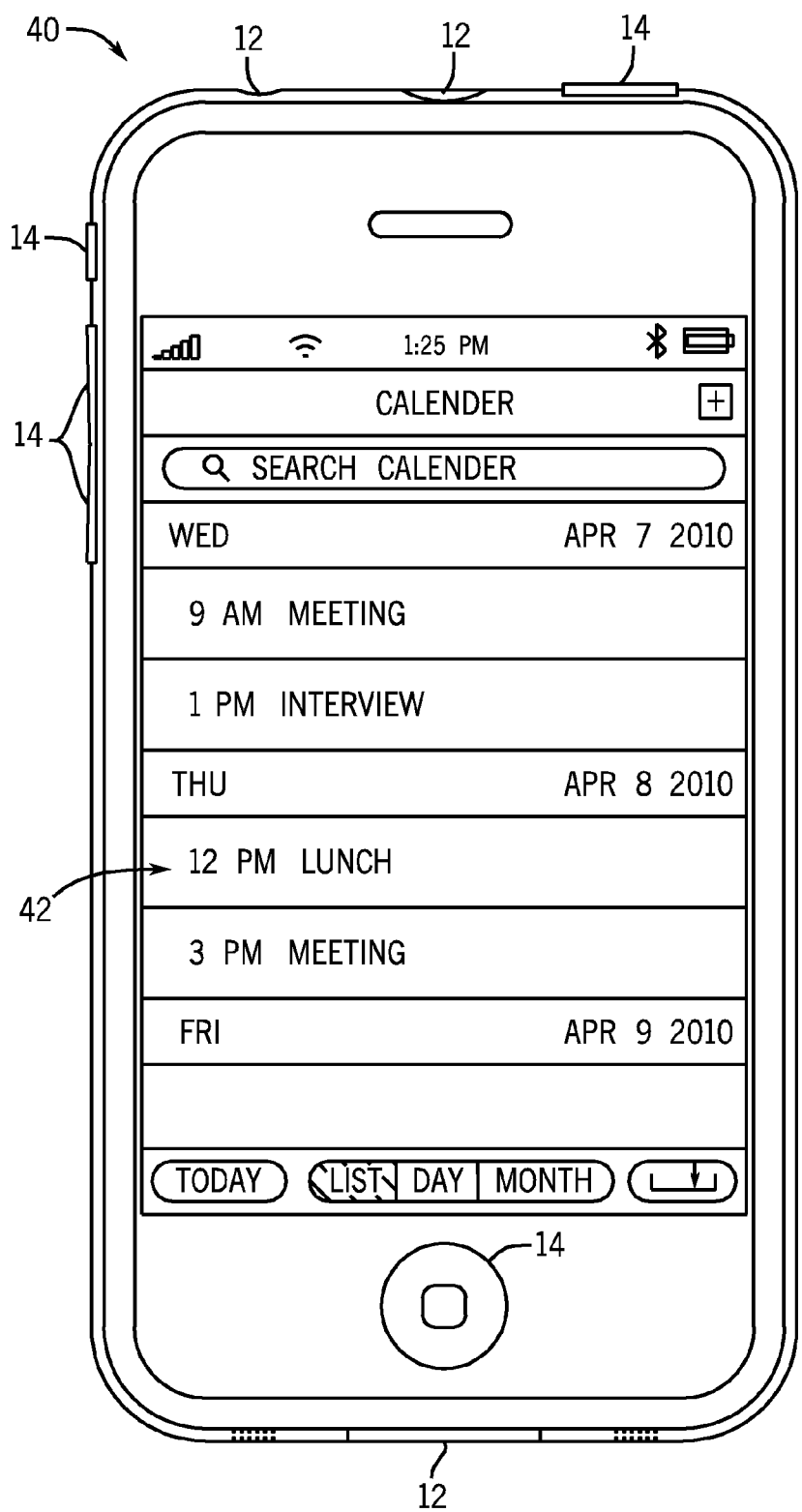
FIG. 7 is a front view of the handheld electronic device of FIG. 3 with a switchable layer of the display set to transmit light in accordance with aspects of the present disclosure.

Conversely, in the example depicted in FIG. 6 the switchable layer 50 is generally transparent, allowing the ambient light 60 to reach and be reflected by the background layer 52. As a result, in this example, the light emanating from the display 10 includes not only the light 62 generated by the OLED panel 34, but also the light 64 reflected by the background layer 52. An example of this effect is depicted in FIG. 7, in which an application screen of the handheld device 40 is depicted as having a generally light or white background which, in accordance with one embodiment, may be implemented by setting a switchable layer 50 of the display 10 to a light transmissive state to allow a white or light background layer 52 of the display 10 to reflect light.

Figure 8:
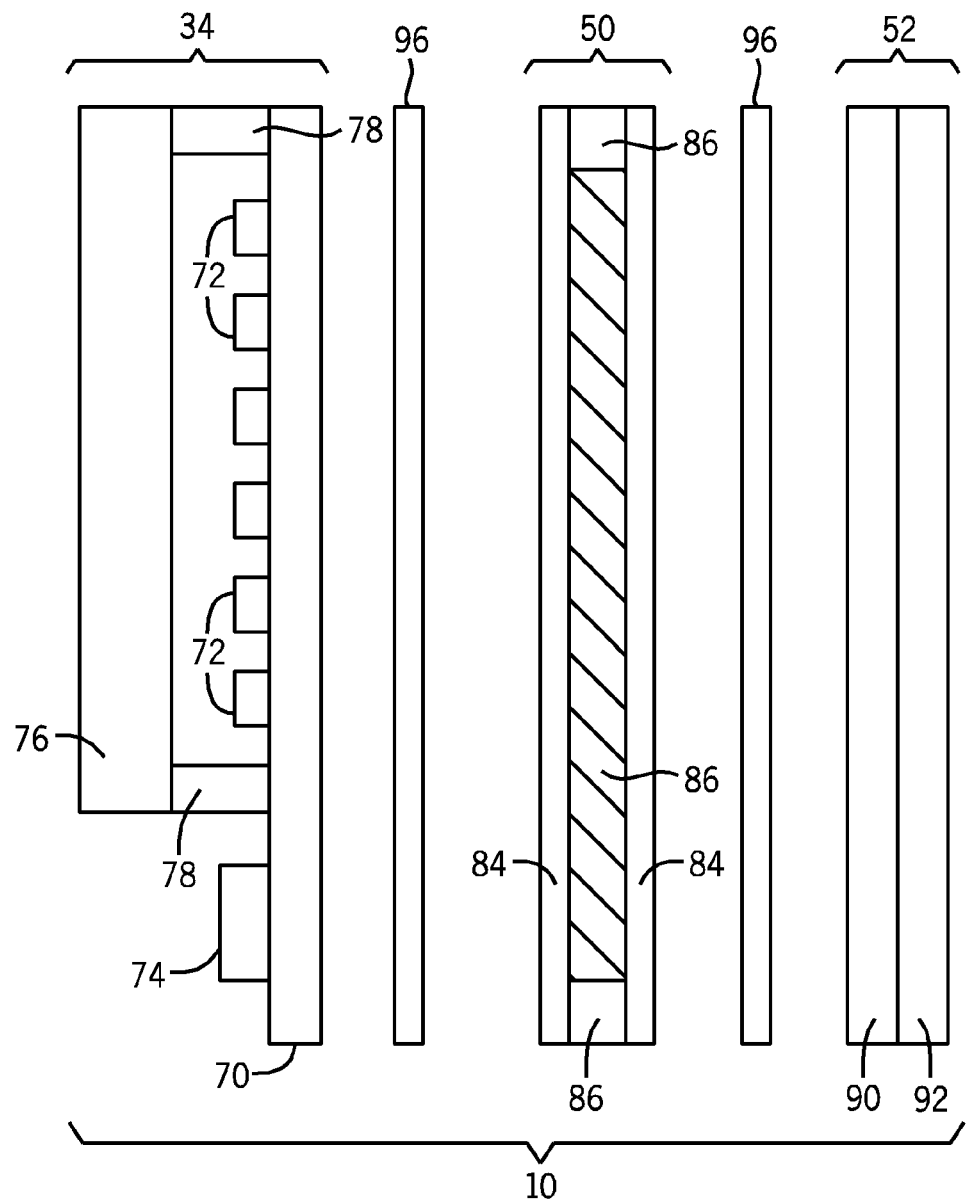
FIG. 8 depicts a schematic view of layers of a display panel in accordance with a further aspect of the present disclosure.

Turning to FIG. 8 a cross-sectional view of the layers present in a particular embodiment are depicted. In this embodiment, an OLED panel 34 is depicted. The OLED panel 34 includes a substrate layer 70 (e.g., a glass substrate layer) on which a thin film transistor (TFT) layer may be formed. The TFT layer may define the various pixels of the OLED display and allow each pixel to be separately addressed. In one embodiment, each pixel may include a layer or layers of organic light emitting diodes 72 printed, deposited, or otherwise formed on the substrate layer 70 and the TFT layer. The operation of the TFT layer and the corresponding pixels of the OLED panel 34 may be coordinated and/or controlled by one or more driver chips 74 (such as a chip-on-glass (COG)) in communication with the TFT layer and/or the one or more processors 16 (FIG. 4).

The OLED panel 34 may also include a cover or external layer 76 (e.g., a cover glass) that forms the external viewing surface facing a viewer. In certain embodiments the cover layer 76 may perform various color filtration and/or polarization functions with respect to the light emitted by the OLED panel 34. In one embodiment, the cover layer 76 and the substrate layer 70 may be bonded together, such as by a glass frit bond 78, along all or part of the periphery of the surface and/or substrate layers. In one implementation, the OLED panel 34 is between about 1.5 mm and 1.9 mm in thickness.

In the depicted embodiment, the switchable layer 50 consists of layers 84 of a clear material, such as polyethylene terephthalate (PET). In one implementation, between the layers 84 is a printed or otherwise deposited layer 86 of active material (e.g., a phosphor-based PSE hybrid material) that can migrate or otherwise be reoriented and/or repositioned based on the presence or absence of an electrical field. The layers 84 surrounding the layer of active material 86 may be bonded together by a suitable bond 86, such as a bond 86 formed using thermal, ultrasonic, and/or mechanical approaches. In one embodiment, the switchable layer 50 is between about 0.1 mm and 0.3 mm in thickness.

The background layer 52 may be provided as a single or multiple layer structure of a solid color (e.g., white) or printed background. For example, in one embodiment the background layer 52 includes a transflective layer 90 positioned over a solid-color substrate layer 92, such as a white substrate layer. The transflective layer 90 acts to both reflect ambient light and to transmit the color and/or pattern of the substrate layer 92. In one implementation, the background layer 52 is between about 0.5 mm and 1.0 mm in thickness.

In one embodiment, the substrate layer 92 may be a printed substrate, e.g., a corporate logo, emblem, name, or mark. In such an embodiment, the printed matter, such as a logo, may be visible when the OLED panel 34 is not emitting light and when the switchable layer 50 is in a transparent state. In such an embodiment, the switchable layer 50 may be implemented or may utilize an approach that results in the switchable layer 50 being transparent in the absence of an electrical field. In such an implementation, the printed matter, e.g., the logo or emblem, present on the substrate layer 92 may be visible when the electrical device 8 is off, i.e., when the display 10 is unpowered.

As depicted in FIG. 8, the various layers of the display 10 may be joined or adhered by various intervening layers. For example, in the depicted embodiment, the OLED panel 34, the switchable layer 50, and the background layer 52 may be adhered or joined using respective layers 96 of an optically clear adhesive (OCA). In one implementation, the layers 96 of OCA may be between about 0.05 mm and 0.15 mm in thickness.

Figure 9:
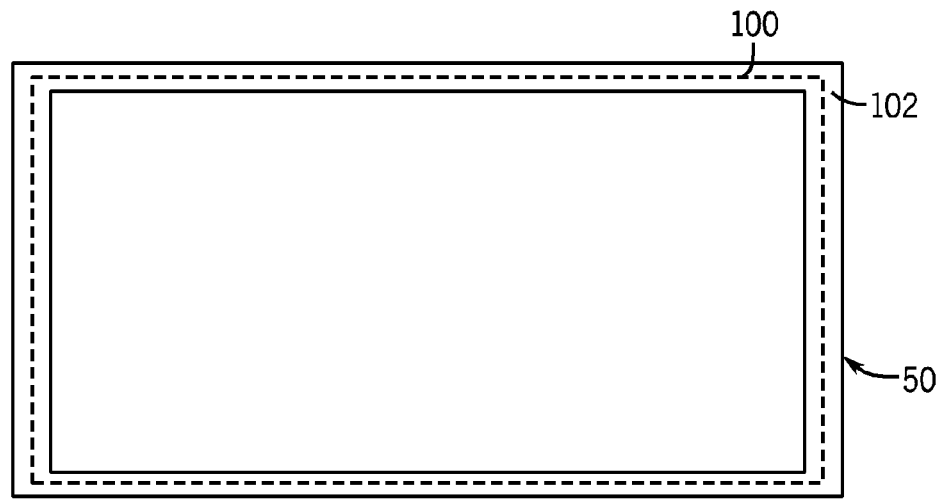
FIG. 9 depicts a view of one implementation of a switchable layer, in accordance with aspects of the present disclosure.

Turning to FIG. 9, a view of one implementation of a switchable layer 50 is depicted. In accordance with this implementation, one or more conductive elements 100, e.g., one or more electrodes, are depicted as encircling the periphery of the switchable layer 50, such as under an opaque bezel 102. The one or more conductive elements 100 may be formed on or within one of the layers forming the switchable layer 50 or may be provided external to the switchable layer 50 but in sufficient proximity such that an electrical field generated by the one or more conductive elements 100 is sufficient to affect the switchable layer 50. In one implementation, the one or more conductive elements 100 may be formed using conductive materials (e.g., metals or alloys) that are opaque or transparent (e.g., indium tin oxide (ITO)).

In the depicted implementation, a current applied to the encircling conductive elements 100 may generate a field that causes the migration or movement of opaque phosphor elements dispersed in the switchable layer 50 to the periphery of the switchable layer 50, i.e., underneath the bezel 102. In this manner, the entire switchable layer 50 may be switched between an opaque state and a transparent state by application of a potential to the one or more conductive elements 100.

Figure 10:
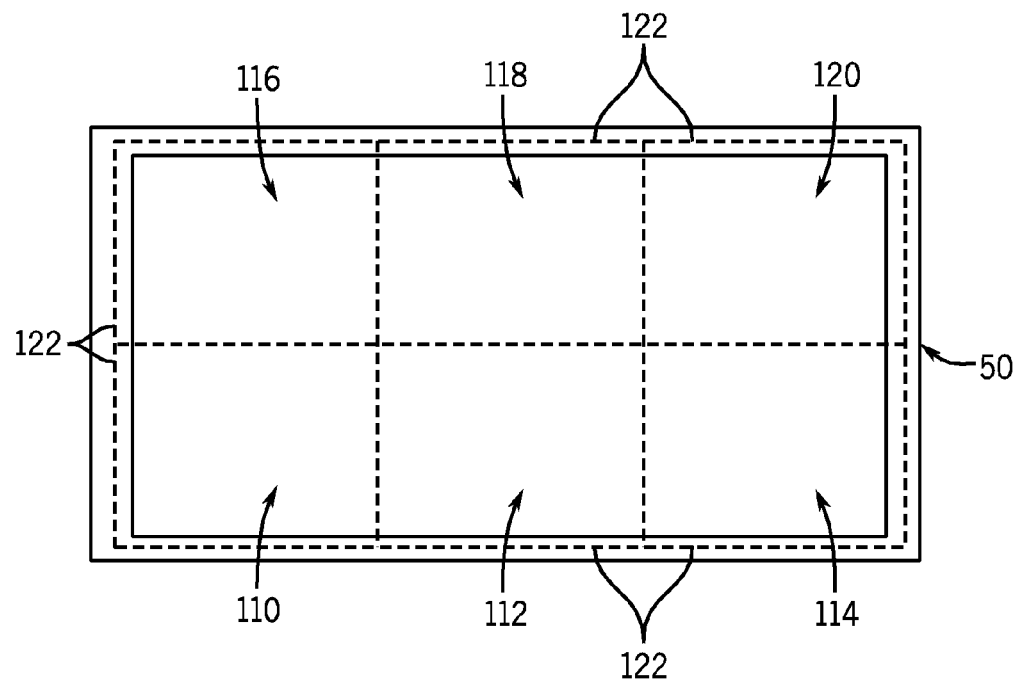
FIG. 10 depicts a switchable layer as being split into a plurality of different regions, in accordance with aspects of the present disclosure.

Turning to FIG. 10, the switchable layer 50 is depicted as being split into a plurality (here six) of different regions (110, 112, 114, 116, 118, 120) that may each be separately addressable to separately switch the regions between opaque and transparent states. In other embodiments, two, four, eight, ten, twelve, sixteen (or more) different and separately addressable regions may be provided in a switchable layer 50. Each region may be defined by distinct and separate conductive elements 122 that may be addressed separately to make one, more than one, or all of the regions 110-120 transparent or opaque at a given moment. In one such implementation, the conductive elements 122 may be formed using opaque conductive materials formed at such thicknesses so as to not be substantially visible to a viewer of the display 10 or may be formed using transparent conductive materials (e.g., ITO). In accordance with the embodiment described in FIG. 10, a processor 16 (FIG. 4) may separately control the opacity/transparency of each region 110-120 as well as the pixels of the OLED display 34 so as to optimize the power used to display a particular combination of background, alphanumeric characters, and/or graphic elements.

Figure 11:
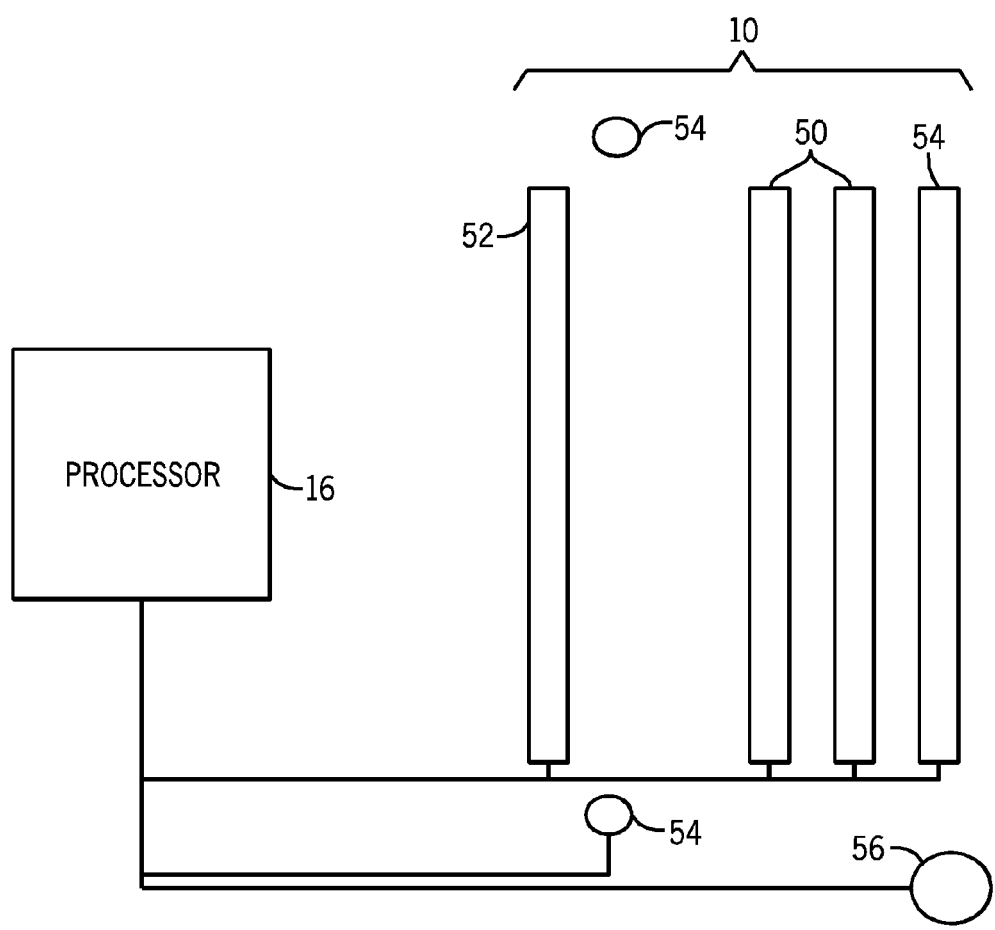
FIG. 11 depicts an embodiment having two separately controllable switchable layers, in accordance with aspects of the present disclosure.

While the preceding discussion, for simplicity, has primarily focused on the use of a single switchable layer, it should be appreciated that, in certain implementations, more than one such switchable layer 50 may be provided. For example, in the embodiment depicted in FIG. 11, two separately controllable switchable layers 50 are provided. In such an implementation, each switchable layer 50 may be split into different regions that are offset from one another such that smaller overall transparent and/or opaque regions may be generated by the combined and coordinated operation of both switchable layers 50.

Alternatively, each switchable layer 50 may include different phosphor or chromic elements such that the color of each switchable layer 50, when in an opaque state, may be different. For example, one of the switchable layers 50 may be substantially black when opaque while another switchable layer 50 may be substantially gray, blue, red, green, or another solid color, when opaque. In this manner, the switchable layers 50 may be utilized to provide various differently colored backgrounds for the overlying transparent OLED panel 34.

It may also be noted that, in certain implementations the transparent OLED panel 34 may be used to filter the ambient light to achieve a desired color effect on the transflective background, i.e., background layer 52. For example, the ambient light may be filtered to achieve a desired complementary color effect on the transflective background layer. In this manner, assuming the transflective background is a white background, the OLED panel 34 may filter the ambient light to generate colors with a large white component (e.g., pink) at the background layer 52. Generating complementary colors in this manner may be desirable for the purpose of power efficiency and/or to achieve a desired aesthetic effect.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display, comprising:
    a transparent light emissive layer capable of displaying one or more colors on a pixel-by-pixel basis, the light emissive layer comprising a plurality of pixels each configured to emit light when activated;
    a background layer comprising a white background; and
    a switchable layer positioned between the light emissive layer and the background layer, the switchable layer having a plurality of separately-controllable regions, each region being larger than any single pixel of the plurality of pixels, wherein each of the plurality of separately-controllable regions of the switchable layer is capable of being switched between a substantially opaque state and a substantially transparent state independently of one another, such that when one of the separately-controllable regions of the switchable layer is in the substantially transparent state the background layer is viewable through the transparent light emissive layer and through the one of the separately-controllable regions of the switchable layer.

2. The display of claim 1, wherein the light emissive layer comprises a layer of organic light emitting diodes.

3. The display of claim 1, wherein the background layer comprises a transflective sheet.

4. The display of claim 1, wherein the background layer comprises a printed logo, emblem, mark, shape, or alphanumeric characters.

5. The display of claim 1, wherein the substantially opaque state prevents viewing of the background layer through the light emissive layer.

6. The display of claim 1, wherein the switchable layer is switched from the substantially opaque state to the substantially transparent state by the application of an electrical field.

7. An electronic device, comprising:
    one or more processors; and
    a display in communication with at least one of the one or more processors, the display comprising:
        a transparent layer comprising a plurality of pixels each configured to emit light when activated;
        a reflective background layer; and
        a switchable layer positioned between the transparent layer and the reflective background layer, wherein an opacity of the switchable layer can be adjusted to control the amount of the reflective background layer that is visible through the switchable layer and the transparent layer of the display, the switchable layer comprising a plurality of separately-controllable regions, each region being larger than any single pixel of the plurality of pixels.

8. The electronic device of claim 7, wherein the electronic device comprises one or more of a desktop computer, a portable computer, a tablet computer, a cellular telephone, a game system, a media player, a camera, or a television.

9. The electronic device of claim 7, wherein the display comprises a touch screen interface.

10. The electronic device of claim 7, wherein the switchable layer comprises a layer of a polymeric solid electrolyte hybrid material.

11. The electronic device of claim 7, wherein the switchable layer comprises a layer of an active material whose optical properties are adjusted by the presence or absence of an electrical field.

12. The electronic device of claim 7, wherein the plurality of separately-controllable regions are each independently adjustable to be substantially opaque or substantially transparent.

13. The electronic device of claim 7, wherein at least one of the one or more processors control operation of the switchable layer.

14. The electronic device of claim 7, comprising a light sensor in communication with at least one of the one or more processors, wherein the operation of the display is controlled at least in part by a signal generated by the light sensor.

15. A display, comprising:
    a transparent layer of organic light emitting diodes comprising a plurality of pixels;
    an opaque background layer; and
    a switchable layer disposed between the transparent layer and the opaque background layer, wherein the switchable layer comprises one or more regions each configured to be separately addressable to be switched between a substantially opaque state and a substantially transparent state such that each of the one or more regions controls visibility of a corresponding underlying portion of the opaque background layer to conserve power consumed by the display, each of the one or more regions being larger than any single pixel of the plurality of pixels.

16. The display of claim 15, comprising one or more background lights configured to illuminate all or part of the opaque background layer.

17. The display of claim 15, wherein the switchable layer comprises a layer of a polymeric solid electrolyte hybrid material.

18. The display of claim 15, wherein a respective region of the one or more regions of the switchable layer is in the substantially opaque state when no electrical field is applied to the respective region and is in the substantially transparent state when an electrical field is applied to the respective region.

19. A method for manufacturing a display, comprising:
    securing a transparent organic light emitting diode layer having a plurality of pixels to a first face of a switchable layer, the switchable layer comprising a plurality of separately controllable regions that can each be independently switched between a substantially opaque state and a substantially transparent state, each of the plurality of separately controllable regions being larger than any single pixel of the plurality of pixels;
    securing a background layer to a second face of the switchable layer opposite the first face; and
    connecting the transparent organic light emitting diode layer and the switchable layer to a processor configured to control operation of the organic light emitting diode layer and to selectively control the substantially opaque and the substantially transparent states of the switchable layer so that during use, the background layer reflects light through the transparent organic light emitting diode layer and at least one of the plurality of separately controllable regions of the switchable layer that is selected to be in the substantially transparent state.

20. The method of claim 19, wherein the organic light emitting diode layer comprises a glass substrate on which a plurality of organic light emitting diodes are formed and a cover glass fit bonded to the glass substrate so as to cover the plurality of organic light emitting diodes.

21. The method of claim 19, wherein switchable layer comprises:
   a hybrid polymeric solid electrolyte material disposed between a first polyethylene terephthalate sheet and a second polyethylene terephthalate sheet; and
   respective electrodes defining boundaries of the one or more respective regions.

22. The method of claim 19, wherein the background layer comprises a transflective layer and a solid or printed sheet.

23. A method for displaying visual representations on a display, comprising:
   providing the display with a transparent layer;
   providing the display with a background layer;
   providing the display with a switchable layer positioned between the transparent layer and the background layer, wherein the switchable layer has a plurality of regions;
   controlling light emission by a plurality of light emitting diodes formed on the transparent layer;
   separately controlling an opacity of one or more of the plurality of regions of the switchable layer, wherein the opacity of the one or more of the plurality of regions of the switchable layer is controlled to be substantially transparent when an electrical field is applied and substantially opaque when the electrical field is not applied such that the background layer is visible through the transparent layer when the electrical field is applied, each of the plurality of regions being larger than any one of the plurality of light emitting diodes; and
   displaying the visual representations through the transparent layer, wherein the visual representations comprise light emitted by the plurality of light emitting diodes and light reflected from the background layer.

24. The method of claim 23, wherein the opacity of the one or more of the plurality of regions of the switchable layer is controlled at least partly in response to ambient light.

25. The method of claim 23, wherein the opacity of the one or more of the plurality of regions of the switchable layer is controlled at least partly in response to the light emissions of the plurality of light emitting diodes.

26. The method of claim 23, wherein the opacity of the one or more of the plurality of regions of the switchable layer is controlled so that a user perceives a white background through a respective region of the one or more of the plurality of regions of the switchable layer when an electrical field is applied to the respective region and a dark background corresponding to the respective region when the electrical field is not applied to the respective region.

* * * * *